US008224638B1

(12) United States Patent
Shirazi et al.

(10) Patent No.: US 8,224,638 B1
(45) Date of Patent: Jul. 17, 2012

(54) MANAGING PROGRAMMABLE DEVICE CONFIGURATION

(75) Inventors: Nabeel Shirazi, San Jose, CA (US); Chi Bun Chan, Longmont, CO (US); Bradley K. Fross, Boulder, CO (US); Shay Ping Seng, San Jose, CA (US); Jonathan B. Ballagh, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 968 days.

(21) Appl. No.: 11/650,176

(22) Filed: Jan. 5, 2007

Related U.S. Application Data

(63) Continuation-in-part of application No. 11/343,367, filed on Jan. 31, 2006, now Pat. No. 7,636,653.

(51) Int. Cl.
*G06F 17/50* (2006.01)
(52) U.S. Cl. .............................. 703/16; 718/1
(58) Field of Classification Search ......... 718/1; 703/16
See application file for complete search history.

(56) References Cited

U.S. PATENT DOCUMENTS

| 6,326,806 | B1 | 12/2001 | Fallside et al. |
| 6,778,531 | B1* | 8/2004 | Kodialam et al. ............ 370/390 |
| 7,080,245 | B2* | 7/2006 | Ballard et al. .................... 713/2 |
| 7,219,343 | B2* | 5/2007 | Almeida et al. .............. 717/172 |
| 7,246,055 | B1 | 7/2007 | Singh |
| 7,689,708 | B1* | 3/2010 | Cihla et al. .................... 709/235 |
| 2003/0110464 | A1 | 6/2003 | Davidson et al. |
| 2003/0195989 | A1 | 10/2003 | Greenblat |
| 2004/0240446 | A1 | 12/2004 | Compton |
| 2005/0108379 | A1 | 5/2005 | Gray et al. |
| 2006/0206300 | A1 | 9/2006 | Garg et al. |
| 2006/0236292 | A1* | 10/2006 | Delp et al. ...................... 716/16 |

OTHER PUBLICATIONS

The Authoritative Dictionary of IEEE Standards Terms: Seventh Edition, 2000.*
U.S. Appl. No. 11/314,486, filed Dec. 21, 2005, Ballagh, Jonathan B. et al., Xilinx, Inc. 2100 Logic Drive, San Jose, California 95124.
Cage Technologies, "WinPcap: The Windows Packet Capture Library", Sep. 23, 2005, 1 page, available at http://www.winpcap.org/.
Xilinx, Inc., "Virtex-4 Embedded Tri-Mode Ethernet MAC User Guide", Sep. 7, 2005, pp. 1-160, UG074, (v1.3), available from Xilinx, Inc., 2100 Logic Drive, San Jose, CA 95124.
Xilinx, Inc., "Tri-Mode Ethernet MAC v2.2", DS297, Jan. 18, 2006, Product Specification, pp. 1-20, available from Xilinx, Inc., 2100 Logic Drive, San Jose, CA 95124.
Ethertype, Jan. 31, 2006, p. 1-58, available at http://standards.ieee.org/regauth/ethertype/eth.txt.
Xilinx, Inc., "System Generator for DSP", User Guide, Nov. 28, 2006, pp. 190-240, vol. 8.2.02, available from Xilinx, Inc., 2100 Logic Drive, San Jose, CA 95124.
Fallside, H. et al., "Internett Connected FPGAs", 2000, pp. 289-290, available from IEEE, 3 Park Avenue, 17th Floor, New York, NY 10016-5997.

(Continued)

*Primary Examiner* — Saif Alhija
(74) *Attorney, Agent, or Firm* — Kevin T. Cuenot

(57) ABSTRACT

A method of managing programmable device configuration can include running a server configuration image within the programmable device and storing a different configuration image within a non-volatile memory communicatively linked with the programmable device. Responsive to a switch request sent from the client to the programmable device over the communications link, the different configuration image can be loaded into the programmable device.

19 Claims, 4 Drawing Sheets

OTHER PUBLICATIONS

Xilinx, Inc., "System ACE CompactFlash Solution", Advance Product Specification, Apr. 5, 2002, DS080, v1.5, pp. 1-69, availabe from Xilinx, Inc., 2100 Logic Drive, San Jose, CA 95124.

Xilinx, Inc., "PAVE Framework (PLD API for VxWorks Embedded Systems)". Product Specification, DS084, Sep. 17, 2001, pp. 1-4, availabe from Xilinx, Inc., 2100 Logic Drive, San Jose, CA 95124.

* cited by examiner

400

| Ethernet Header | | | Ethernet Payload |
|---|---|---|---|
| Destination MAC Address | Source MAC Address | EtherType | Configuration Protocol Data |

| Ethernet Header | Ethernet Payload | | |
|---|---|---|---|
| | IP Header | UDP Header | UDP Payload |
| | Source IP and Destination Address | Port Number | Configuration Protocol Data |

FIG. 5

MANAGING PROGRAMMABLE DEVICE CONFIGURATION

BACKGROUND

1. Field of the Invention

The present invention relates to the field of electronic systems and circuits and, more particularly, to managing configuration of a programmable logic device.

2. Description of the Related Art

Electronic circuit designs can be constructed, simulated, debugged, and translated into electronic hardware using a High Level Modeling System (HLMS). Typically, an HLMS is implemented as a software-based design tool which provides blocks that can be combined to build an electronic circuit. A block refers to a high level software construct that represents a particular circuit function, such as multiplexing, addition, multiplication, or the like. Blocks may have ports that can produce and consume signals, and may be arranged within the HLMS to form a circuit. Communication among the blocks can be represented by wires, or signals, that graphically link the blocks. The design may be simulated within the HLMS once it is constructed. Some HLMS tools can generate a hardware implementation from the block representation of the circuit design. For example, an HLMS can generate the bitstream necessary to program a field programmable gate array (FPGA) or can generate the hardware description language (HDL) files necessary to specify the hardware design.

One example of an HLMS is System Generator for DSP™, available from Xilinx, Inc. of San Jose, Calif. (Xilinx). System Generator for DSP™ is a system level modeling tool that facilitates FPGA hardware design. System Generator for DSP™ provides a wide range of blocks that can be automatically compiled into a design suitable for an FPGA. Among these blocks are high level abstractions that implement complex functions, including digital signal processing as well as communication and control logic. In addition, access to underlying FPGA resources can be provided through low level block abstractions that facilitate the construction of highly efficient FPGA designs.

An electronic design typically is simulated in an HLMS using program logic that models block behavior. It also is possible to incorporate circuit designs, which already have been implemented in hardware, into HLMS simulations. To do so, the computer system hosting the HLMS is connected to the device under test (DUT) via a high bandwidth communication channel, although a low bandwidth communication channel may be used in cases where co-simulation runtime is not of the essence. The DUT typically is a circuit design implemented within a programmable logic device (PLD) such as an FPGA. The PLD is installed on a hardware platform, or circuit board, which is coupled to the host computer system via a communications link. The process of running a simulation involving a hardware platform and a software platform working cooperatively with one another is referred to as hardware co-simulation.

In the course of performing hardware co-simulation, it becomes necessary to reconfigure the PLD at the start of each simulation. One reason for reconfiguring the PLD is that the circuit design being simulated, the DUT, often is dynamic. As such, the circuit design may complete different simulation runs in different states. Further, several of the resources available within devices such as FPGAs lack explicit reset mechanisms. For example, block memories and SRL16s, as are available within the Xilinx Virtex family of FPGAs, lack explicit resets. These sorts of resources must be reprogrammed to a known state prior to the start of a simulation, thereby necessitating the reprogramming of the FPGA.

FPGAs typically are configured, or programmed, using a programmable read-only memory (PROM). The bitstream, also referred to as the configuration image, that is loaded into the FPGA to program the DUT is stored in the PROM. The configuration image is serially loaded into the FPGA upon power-up. This technique can be undesirable for situations in which frequent programming of the PLD is needed, i.e. hardware co-simulation. If the DUT is changed, the PROM itself must be reprogrammed for each different configuration of the DUT. This process can be burdensome in that the PROM must be erased and then reloaded for each different configuration of the FPGA.

It would be beneficial to provide a technique for managing PLD configuration in a manner that addresses the limitations described above.

SUMMARY OF THE INVENTION

The embodiments disclosed herein provide methods, systems, and apparatus relating to managing programmable logic device (PLD) configuration. One embodiment of the present invention can include a method of PLD configuration including running a server configuration image within the PLD and storing a configuration image within a non-volatile memory communicatively linked with the PLD. Responsive to a switch request sent from a client to the PLD over a communications link, the configuration image can be loaded into the PLD. In one embodiment, the configuration image can be received within the PLD from the client over the communications link.

The method also can include first loading the server configuration image into the PLD responsive to a power-on condition. The server configuration image can be loaded from the non-volatile memory. The method further can include receiving, within the PLD, auxiliary data sent from the client over the communications link and storing the auxiliary data within the non-volatile memory. The PLD, while programmed with the configuration image, can access the auxiliary data from the non-volatile memory.

The PLD can be re-loaded with the server configuration image responsive to a switch request received from the client over the communications link. The PLD, while programmed with the server configuration image, can monitor the communications link for requests from the client. Accordingly, the PLD can be alternately loaded with the server configuration image and at least one other configuration image responsive to requests received from the client via the communications link.

Where a plurality of configuration images are stored within the non-volatile memory, loading the configuration image into the PLD can include first selecting a configuration image indicated by the switch request from the plurality of configuration images stored within the non-volatile memory.

Another embodiment of the present invention can include a system for managing PLD configuration. The system can include a client, a PLD communicatively linked with the client, and a non-volatile memory configured to store at least one configuration image for the PLD. The client and the PLD can be remotely located from one another. The system further can include a controller that selectively loads a configuration image stored in the non-volatile memory into the PLD responsive to a request sent from the client.

The PLD, upon power-on, can be loaded with a server configuration image that causes the PLD to listen for configuration data sent from the client. The PLD can receive a configuration image from the client and store the configuration image within the non-volatile memory for subsequent use. The PLD further can receive auxiliary data from the client, store the auxiliary data within the non-volatile memory, and, while loaded with a configuration image, access the auxiliary data from the non-volatile memory.

The non-volatile memory can store a server configuration image and at least one other configuration image. Accordingly, the controller, responsive to requests from the client, can alternately load the server configuration image and the other configuration image into the PLD from the non-volatile memory.

Another embodiment of the present invention can include a machine readable storage, having stored thereon, a computer program having a plurality of code sections executable by a machine for causing the machine to perform the various steps or functions disclosed herein.

BRIEF DESCRIPTION OF THE DRAWINGS

There are shown in the drawings, embodiments which are presently preferred, it being understood; however, that the invention is not limited to the precise arrangements and instrumentalities shown.

FIG. 4 is a block diagram illustrating a packet structure in accordance with another embodiment of the present invention.

FIG. 5 is a block diagram illustrating a packet structure in accordance with another embodiment of the present invention.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to managing programmable logic device (PLD) configuration or programming. More particularly, the embodiments disclosed herein facilitate the configuration of a PLD, such as a field programmable gate array (FPGA), from a client system, which can be remotely located from the PLD. The PLD can be reconfigured, or reloaded, with a different configuration image responsive to a command sent from the client system over a communications link. Though applicable to hardware co-simulation, the embodiments disclosed herein also can be applied to circuit designs and/or systems outside the realm of hardware co-simulation.

Figure 1:
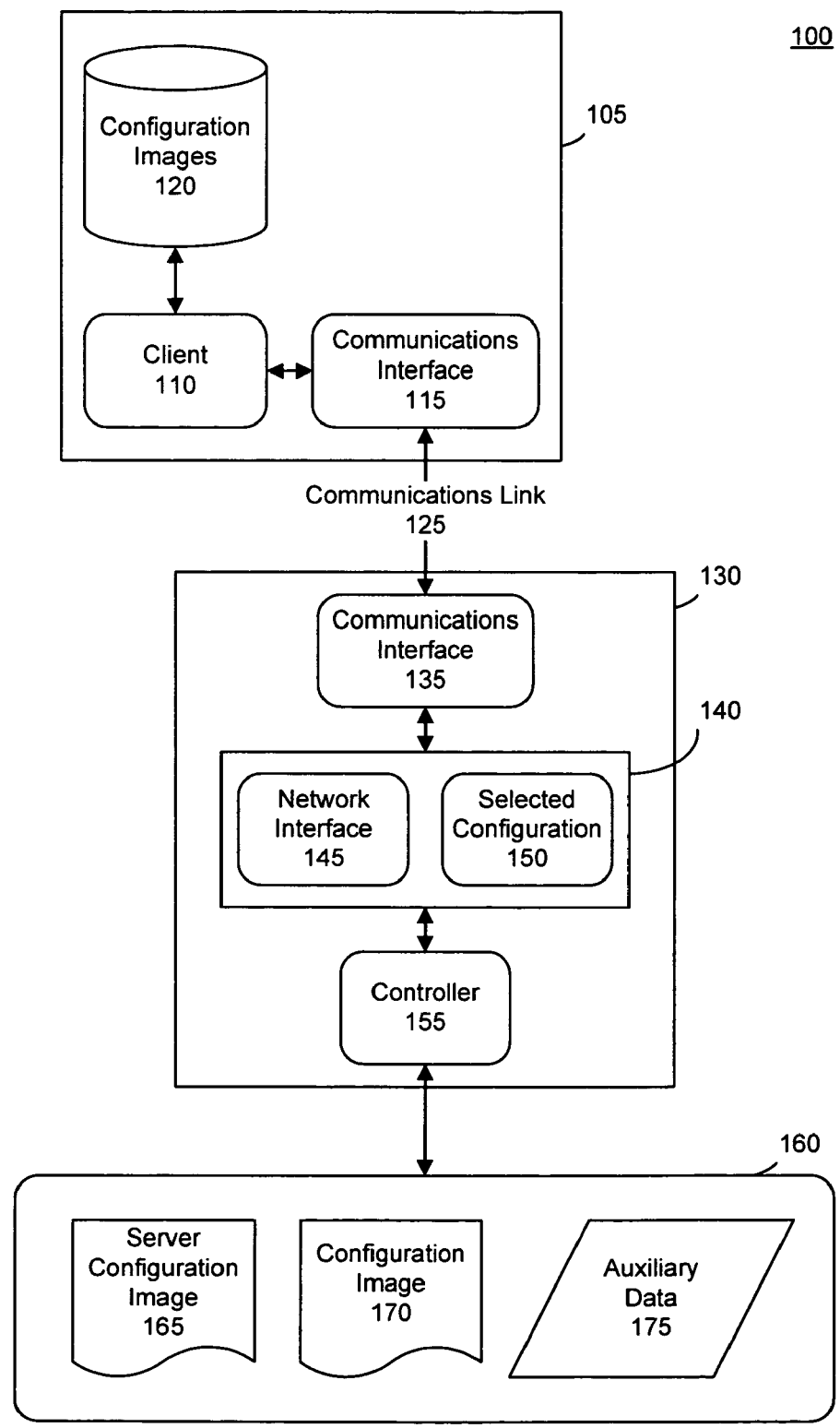
FIG. 1 is a schematic diagram illustrating a system for managing programmable logic device (PLD) configuration in accordance with one embodiment of the present invention.

FIG. 1 is a schematic diagram illustrating a system 100 for managing PLD configuration in accordance with one embodiment of the present invention. As shown, system 100 can include a client system 105, a hardware platform 130, as well as a non-volatile memory (memory) 160. The client system 105 can include a client 110, a communications interface 115, and a data store comprising configuration images 120.

The client system 105 can be implemented as an information processing system, such as a computer system executing appropriate software, i.e. the client 110. In one embodiment, the client 110 can be an application program configured to communicate with the hardware platform 130 and initiate configuration of a PLD 140 disposed thereon, i.e. as in the case of a dynamic electronic system unrelated to hardware co-simulation.

In another embodiment, in the context of hardware co-simulation, the client 110 can be implemented as a high level modeling system (HLMS). As noted, hardware co-simulation refers to the situation in which a hardware design, in this case implemented in PLD 140, is incorporated within a simulation environment provided by the HLMS, in this case client 110. This allows an actual hardware design implementation in PLD 140 to be tested in conjunction with various software-based models of physical systems and/or components executing within the HLMS.

In terms of hardware co-simulation, the HLMS can include a hardware co-simulation block (not shown), which is a software proxy for the PLD 140. The hardware co-simulation block can function much the same way as other software blocks of the HLMS in that signals from other blocks (i.e. software-based models of physical components and/or systems) within the HLMS can be consumed by the hardware co-simulation block and signals generated by hardware co-simulation block can be provided to, and interpreted by, other blocks within the HLMS.

The hardware co-simulation block communicates with a co-simulation engine, which can be included within client system 105, though not shown. The co-simulation engine typically is distinct from the HLMS, but can execute within the client system 105 nonetheless. In general, the hardware co-simulation block provides generic function calls to the co-simulation engine. These generic function calls can include, but are not limited to, opening and closing the hardware platform 130, managing data I/O with the hardware platform 130, and controlling clock sources for the PLD 140. The co-simulation engine translates the generic function calls from the hardware co-simulation block into instructions specific to the hardware platform 130, and thus, the PLD 140.

The configuration images 120 can be software representations of circuit designs, whether user-specified or obtained through other channels. The configuration images 120 can be stored configuration bitstreams that can be loaded into the PLD 140 to configure the PLD 140 with a specific circuit design. Client system 105 can communicate with hardware platform 130 via communications interface 115. Communications interface 115 can be implemented to support any of a variety of different physical connections, whether wired or wireless, and communications protocols, including, but not limited to, TCP/IP, Joint Test Action Group (JTAG) or IEEE Standard 1149.1, Universal Serial Bus (USB), Peripheral Component Interconnect (PCI), Ethernet, point-to-point Ethernet, or the like.

As used herein, "point-to-point Ethernet" refers to a connection where the client system 105 and the PLD 140 are not located across a network, as in the case of TCP/IP, but rather have a direct linkage between one another. In one embodiment, a point-to-point Ethernet connection can refer to a connection that is established using the raw Layer-2, i.e. the data link layer, of the Ethernet protocol within a same broadcast domain. One example of such a connection is an Ethernet local area network constructed using a direct linkage or a Layer-2 Ethernet switch. Within such a configuration, data can be addressed directly with unique Ethernet media access control (MAC) addresses without any higher layer of network protocol encapsulation, address translation, and/or routing. Still, as noted, the embodiments disclosed herein can be used with any of a variety of different communication protocols depending upon the particular application to which the inventive arrangements are to be applied.

Communications can be exchanged between the communication interface 115 and a communications interface 135 within the hardware platform 130 via communications link 125. Accordingly, communications interface 115 within client system 105 and communications interface 135 of the hardware platform 130 can be configured to work cooperatively with one another, communicating over communications link 125 using one of the aforementioned communications protocols or other suitable communication scheme. Thus, communications interface 135 can be implemented to support the same communication protocols and physical connections as communications interface 115 and relay communications between the communications link 125 and the PLD 140.

The hardware platform 130 and the client system 105 can, but need not, be remotely located from one another, whether implemented as two disparate systems, located in different physical locations, etc. The hardware platform 130 can include the communications interface 135, as discussed, the PLD 140, as well as a controller 155. In one embodiment, the PLD 140 can be implemented as an FPGA. The PLD 140 can include a network interface 145 which is configured to relay information between the system implemented on the PLD 140, i.e. the selected configuration 150, and the communications interface 135.

In an embodiment where the communications link 125 is implemented as a point-to-point Ethernet connection, network interface 145 can be implemented as an Ethernet MAC. In that case, the Ethernet MAC can be implemented as a sub-layer of the data link networking layer. This sub-layer can communicate directly with the Ethernet physical connection, i.e. communications interface 135, and is responsible for framing, multi-access control, and delivering error-free data. It should be appreciated that the network interface 145 can be implemented as any suitable interface that may be necessary to link the communication interface 135 with the selected configuration 150 within the PLD 140 according to the particular type of physical connection and communications protocol used.

The selected configuration 150 can be one of a plurality of circuit designs, i.e. image files, which can be selected and loaded into PLD 140 responsive to one or more instructions from the client system 105. The selected configuration 150 can be originally sent from the client system 105 and stored in memory 160 until such time that a command is received indicating that the selected configuration 150 is to be loaded into the PLD 140. In another embodiment, the selected configuration 150 can be pre-stored within memory 160.

The controller 155 functions as an interface between the PLD 140 and the memory 160. As such, the PLD 140 can read from, and write to, the memory 160 through controller 155. Though controller 155 is depicted as being disposed upon hardware platform 130, it should be appreciated that the controller 155 need not be located on hardware platform 130. Similarly, though memory 160 is shown as being located separately from hardware platform 130, memory 160 can be disposed upon the hardware platform 130 if so desired.

In one embodiment, controller 155 and memory 160 can be implemented as one of the System ACE™ family of products available from Xilinx, Inc. of San Jose, Calif. (Xilinx). The System ACE™ CF product, for example, utilizes a compact flash memory for memory 160. Presently, System ACE™ CF can accommodate memory modules ranging from 64 Mbits to over 1 Gbit, or IBM Microdrives, currently ranging from 2 Gb to 8 Gb. This allows configuration data, in reference to configuration images 170 and/or auxiliary data 175, to be stored for one or more different PLDs. Because memory 160 is implemented as a removable medium, changes or upgrades to the memory contents or density can be performed by exchanging removable modules or by programming in system. Controller 155 can be implemented as the ACE Controller chip which has built-in control logic with a variety of specialized interfaces. Accordingly, controller 155 can serve as the interface to the memory 160, one or more PLDs 140, the client system 105, and/or another system microprocessor. The default configuration mode for controller 155 can take configuration images 170 or the server configuration image 165 from the memory 160 and configure the PLD 140.

The memory 160 can include a server configuration image 165, one or more configuration images 170, as well as auxiliary data 175. The server configuration image 165, when loaded into the PLD 140, causes the PLD 140 to listen for requests from the client system 105. In particular, the server configuration image 165 can cause the PLD 140 to listen for commands indicating that a configuration image is being sent and/or to load a particular configuration image from the memory 160 into the PLD 140. In one embodiment, for example when the PLD 140 is implemented as one of the Virtex family of FPGA devices from Xilinx, the server configuration image 165 can configure a MicroBlaze or a PicoBlaze soft processor of the PLD 140 to perform the functions described herein.

When configured using the server configuration image 165, the PLD 140 can perform tasks including, but not limited to, packet filtering, header removal, header injection, clock domain crossing, data marshalling, as well as data-width conversion. It should be appreciated that the particular network-related tasks to be performed by the server configuration image 165 can vary depending upon the application and/or the communication protocol used. Accordingly, the list of networking operations disclosed herein is not intended to be a limitation of the present invention, but rather serve as examples of possible functions which can be performed.

The memory 160 can include one or more other configuration images 170. Each configuration image 170 can be a user circuit design that can be loaded into the PLD 140 responsive to requests from the client system 105. In one embodiment, the client system can transmit configuration data to the hardware platform 130. As noted, configuration data can include one or more configuration images 170 and/or auxiliary data 175. The PLD 140, when loaded with the server configuration image 165 can listen for such user configuration data and store it within the memory 160. Responsive to a command from the client system 105, the controller 155 can select a user configuration image 170 and load the selected configuration image 170 into the PLD 140.

The auxiliary data 175 can be any of a variety of different data that does not implement a circuit design in the PLD 140 or otherwise program the PLD 140. The auxiliary data 175 can include network addressing information, tabular data, audio, video, or other files that the PLD 140, once programmed, may need to access during operation. Accordingly, the PLD 140, when loaded and operating, can access the memory 160 to obtain any needed information that may be stored within auxiliary data 175, i.e. similar to a file server. In one embodiment a configuration image 170 and any associated auxiliary data 175 can be encapsulated and sent as a single piece of data.

Figure 2:
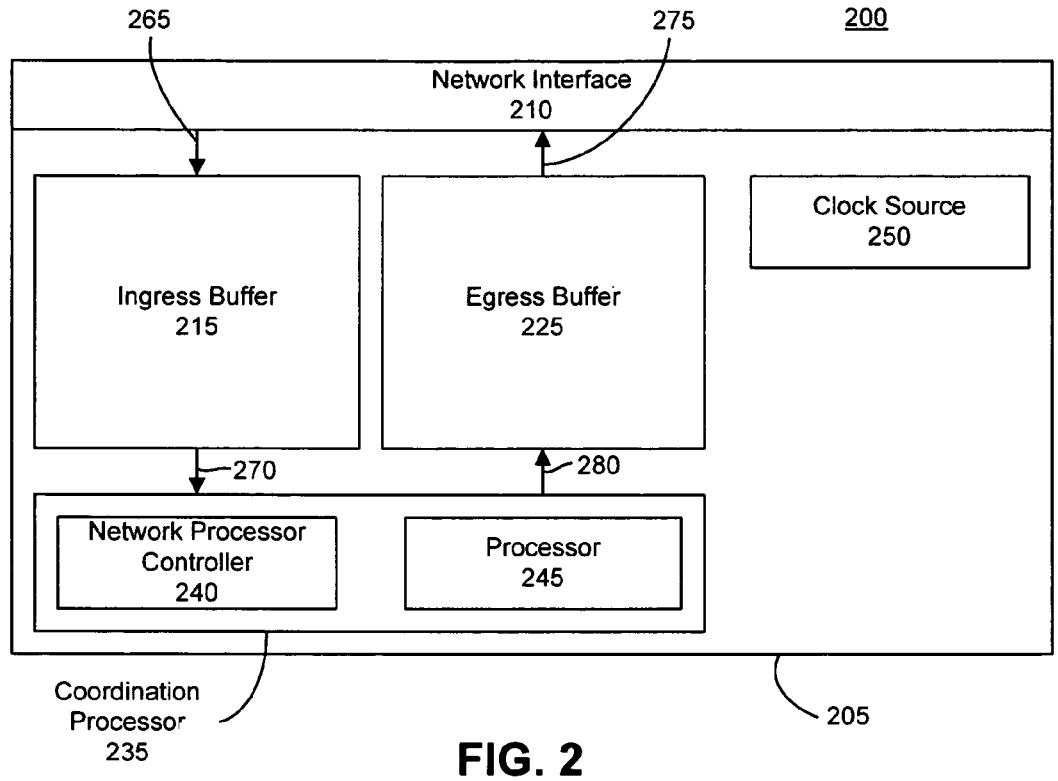
FIG. 2 is a schematic diagram illustrating a server architecture for a PLD in accordance with another embodiment of the present invention.

FIG. 2 is a schematic diagram illustrating a server architecture 205 that can be implemented within a PLD 200 in accordance with another embodiment of the present invention. In one embodiment, the server architecture 205 can be implemented by the server configuration image discussed with reference to FIG. 1. Server architecture 205 can be particularly useful in an embodiment where the communications link between the client system and the hardware platform is implemented as a point-to-point Ethernet connection. In that case, the PLD 200 can include a network interface 210 which can be implemented as an Ethernet MAC.

The server 205 can include an ingress buffer 215, an egress buffer 225, a coordination processor 235, as well as a clock source 250. The ingress buffer 215 can perform functions such as buffering, queuing, filtering, metadata processing, and header removal. The ingress buffer 215 and the egress buffer 225 can be implemented using any of a variety of suitable memory structures or devices. Examples of possible memory types can include, but are not limited to, Random Access Memory (RAM) and first-in-first-out (FIFO) memory.

The ingress buffer 215 can be formed from one or more block memories (BRAMs) that are embedded inside the PLD 200. In one embodiment, the BRAMs can be dual port BRAMs where each data port can operate at a different clock frequency. Further, each data port of the dual port BRAM can be configured with a different memory aspect ratio if so desired. Egress buffer 225 can perform functions such as buffering and header injection. Like ingress buffer 215, egress buffer 225 can include one or more BRAMs forming an output buffer. The BRAMs of the egress buffer 225 also can be dual port BRAMs where each data port is driven at a different clock frequency, if need be, and further may have a different memory aspect ratio if so desired.

The coordination processor 235 can include a network processor controller (NPC) 240 and a processor 245. In one embodiment, the NPC 240 can be implemented with logic from the fabric of PLD 200 and need not be implemented using actual processor or CPU resources. The processor 245 can be implemented using a soft processor that executes configuration server code. The NPC 240 can process packets stored within ingress buffer 215, which were received from the network interface 210, and remove header information from the packets. Processed packets can be forwarded from the NPC 240 to the processor 245, which functions as an interface to other systems, i.e. other portions of the PLD 200, the controller to the non-volatile memory, etc. For example, the processor 245 can obtain qualified packets from the NPC 240 and further process such packets according to the configuration protocol used. The processor 245 further can communicate with the controller for reading and/or writing to the non-volatile memory and reconfiguring the FPGA. With respect to outgoing packets, the NPC 240 can obtain data from the processor 245 and write such data to egress buffer 225. Egress buffer 225 can be pre-initialized to include a vector specifying header information which can be used by the NPC 240 to inject header information into data written into BRAM 230, thereby packetizing the data.

Clock source 250 can drive various portions of the PLD 200. In one embodiment, clock source 250 can include a plurality of different clock sources capable of driving components at different frequencies. In an embodiment where BRAMs are used to implement the ingress and/or egress buffers 215 and 225, different ones of the data ports of the BRAMs can be driven at different frequencies. For example, data port 265 of ingress buffer 215 and data port 275 of egress buffer 225 can be driven by clock source 250 at the same frequency at which network interface 210 is driven. This frequency can conform to the network communication protocol used to communicate with the client system.

As noted, in one embodiment, the data ports of the ingress and egress buffers 215 and 225 that are connected with the coordination processor 235, i.e. data ports 270 and 280, can be driven at a different clock rate, such as the frequency at which the coordination processor 235 operates. This can be the same frequency as the rest of the PLD 200. Operating the different data ports at different frequencies allows each buffer to perform clock domain crossing as data can be read into each buffer using one data port clocked at a first frequency and read out via a different data port clocked at a second and different frequency.

Use of ingress and egress buffers 215 and 225 reduces operations such as packet buffering, classification/qualification, and header removal into read/write operations implemented within the buffers. The operations can be carried out concurrently and "on-the-fly" when the packet data is streamed into the ingress buffer 215 of the network processor 205. Header removal and injection can be achieved with little or no latency by adjusting the buffer address(es).

Selected functions and/or components of server 205 can be changed by setting different values for hardware description language (HDL) generics during compilation. In illustration, it may be desirable to change the size of the ingress buffer 215 and/or egress buffer 225 at compile time to optimize resource usage for a given application. Some applications may not require a memory buffer that is as large as that which may required by other applications. Other modules and/or functions of the server 205 can be modified as may be required according to the particular application in which the server 205 is to be used. Such modifications can be accomplished by changing the values of other HDL generics. Such parameterization is possible as the server 205 is implemented using PLD technology.

Network interface 210 of the PLD 200 can receive input from the client system in the form of a byte stream. Network interface 210 can store the incoming packets within a sequential address space within the ingress buffer 215. In one embodiment, the sequential address space of the ingress buffer 215 further can be pre-initialized with a vector starting at address 0. The portion of the address space containing the vector can be maintained as read-only memory. The vector can be used to store an Ethernet header template which can be used by the NPC 240 to filter out unrelated packets.

Incoming packets can be matched against the vector stored in the ingress buffer 215. Any packets that do not match can be discarded. If (1) the destination MAC address is the PLD 200 MAC address, if (2) the source MAC address is the client system MAC address, and if (3) the EtherType is a predefined value, the packet is destined for the PLD 200. After the header of the incoming packet is examined, the remaining packet data can be written to ingress buffer 215.

Thus, for the NPC 240 to filter incoming frames, the MAC addresses of the client system and PLD 200 must be specified and stored as the Ethernet header template in the ingress buffer 215 and egress buffer 225 before hardware co-simulation begins. As noted, a header template can be pre-installed in the egress buffer 225 and used for injecting header information to packetize co-simulation data being sent from the server 205 to the client system.

In one embodiment of the present invention, Ethernet header templates can be installed through buffer content initialization using a tool such as the Data2MEM Memory Tool (Data2MEM) available from Xilinx. Data2MEM allows binary code to be converted into memory contents. The code becomes part of the bitstream used to configure PLD 200. Facilitating post-implementation modification of the Ethernet header template allows users to choose different network interface cards after a particular PLD design has been compiled. A tool such as Data2MEM allows the Ethernet header template to be dynamically modified to reflect the current host MAC address before hardware co-simulation begins and supports bitstream reuse, thereby saving time.

In another embodiment, Ethernet header template information can be stored as auxiliary data within the non-volatile memory. The server 205, once loaded into the PLD 200, can then access the data from the non-volatile memory and load such content into the ingress buffer 215 and egress buffer 225 as may be required.

The network interface 210 can determine whether a received packet is qualified or unqualified by examining the frame check sequence (FCS) portion of the packet. If the FCS portion of the packet includes an error, the packet can be marked as a bad packet or frame. The network interface 210 further can mark a frame as bad in the case of an overflow of the address space.

Regardless of the particular configuration of the server 205 or the type of communication protocol used to communicate with the client system, a server configuration image which implements the server 205 can be loaded into the PLD 205 automatically when the PLD 205 is powered on. The server configuration image can be stored within the non-volatile memory and can be loaded automatically by the controller discussed with reference to FIG. 1.

Figure 3:
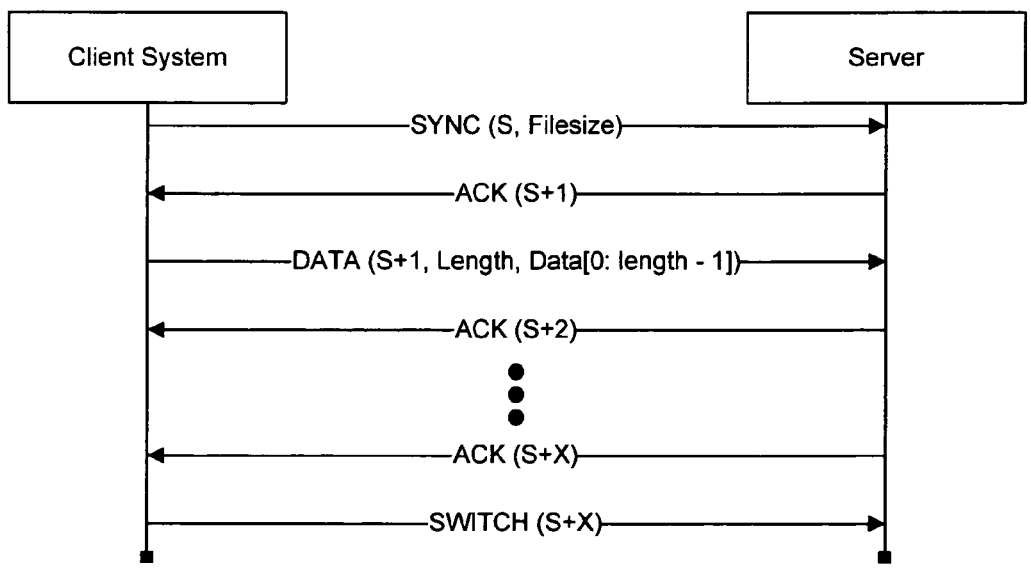
FIG. 3. is a message flow diagram relating to configuration of a PLD in accordance with another embodiment of the present invention.

FIG. 3. is a message flow diagram relating to configuration of a PLD in accordance with another embodiment of the present invention. FIG. 3 illustrates the messages or signaling that can transpire between the client system and the server implemented within the PLD as illustrated with reference to FIG. 1. The message flow can take place after the PLD has been powered on and has been loaded with a server configuration image from the memory. As noted, the server enters a listening state which awaits a request, or particular packets of information, from the client system.

Though FIG. 3 is described in the context of hardware co-simulation, it should be appreciated that the messaging scheme disclosed herein can be applied to a deployed system design to enable the same, or similar, switching from one configuration to another within one or more PLDs. In any case, with regard to hardware co-simulation, a user operating the client system, i.e. working within an HLMS, can issue a command for hardware co-simulation. The client system, in response, can begin the configuration process by issuing a SYNC request to the server executing within the PLD. The SYNC request notifies the server that a configuration image will be sent from the client system. Each message can include a sequence number, denoted as "S", which identifies that message within the message or packet stream. The SYNC request further includes an indication of the size of the file, i.e. the configuration image for the PLD that is to be sent.

In cases where more than one communication protocol can be used, the SYNC request can specify the particular type of communication protocol that is to be used in the series of transactions to follow. Since the server can be configured to communicate using any of a variety of different communications protocols, the SYNC request can indicate which of those protocols will be used. In one embodiment, the server can be configured to communicate using Universal Datagram Protocol (UDP) or raw Ethernet-based communications. Accordingly, based upon the packet format of the SYNC request, the server can utilize either UDP or raw Ethernet for the remaining communications.

The server can respond to the SYNC request with an ACK if the SYNC was received without error. As shown, the ACK includes a sequence number of "S+1". The sequence number specified in the ACK messages indicates the next sequence number expected by the server executing within the PLD. The sequence number from one successful communication from the client system to the next can be incremented, in this case by one. By using sequence numbers, packet loss can be overcome, or limited, as either the client system or the PLD can request retransmission of a particular message. This is particularly beneficial when a connectionless communication scheme, such as UDP or raw Ethernet, is used.

Both the client system and the server can maintain state information relating to the communication stream to track packet, or message, sequencing. The client system does not proceed to the next request until a valid acknowledgement is received for the previous request from the server. To avoid indefinite waiting due to packet loss or network congestion, the client system also can implement a timeout to trigger a retransmission of the request if the corresponding acknowledgement is not received within the allotted time. If the acknowledgement is lost, thereby leading to multiple transmissions of a request, the server can skip further processing of the request, but reply with a valid acknowledgement.

Following the SYNC request, the client system can packetize the configuration data that is to be sent to the PLD into a sequence of DATA requests. The server can buffer the DATA requests onto the memory and reassemble the original configuration data once fully received. Once the complete configuration data has been reassembled and stored within the memory, the client system can request that the server switch over to the configuration image just sent by sending a SWITCH request. It should be appreciated that the client system can send a plurality of configuration images to the PLD to be stored in the memory. Accordingly, at a later point in time, the client system can request that a particular one of the plurality of configuration images be loaded into the PLD using the aforementioned process. That is, a switch request need not be immediately preceded by sending configuration data.

FIG. 4 is a block diagram illustrating a packet structure 400 in accordance with one embodiment of the present invention. FIG. 4 illustrates the packet structure 400 in the case where raw Ethernet is used to communicate between the client system and the server. The Ethernet header can be used to differentiate configuration packets from other packets by identifying a particular EtherType value. The Ethernet payload can encapsulate the configuration protocol data, which has the same format regardless of the packet format used. The configuration protocol data can include an opcode that differentiates between SYNC, DATA, SWITCH, and ACK packets. The protocol data further can include the sequence number as well as the data length identifier. In the case of a SYNC packet, the protocol data further can specify the length of the entire configuration image to be sent.

In general, the terms "frame" and "packet" are used interchangeably throughout this document to refer to the unit of data exchanged between the client system and the PLD. In one embodiment, the term "frame" can refer to a raw Ethernet frame formatted according to IEEE standard 802.3. Specifically, the Ethernet II frame format can be used where the 13$^{th}$ and the 14$^{th}$ bytes immediately following the preamble are used as a type field for protocol identification. Accordingly, the term "packet" also can refer to a frame in the context of Ethernet co-simulation, which has the appropriate alignment in the frame layout and which encapsulates metadata and commands and/or responses as the frame payload.

FIG. 5 is a block diagram illustrating a packet structure 500 in accordance with one embodiment of the present invention. FIG. 5 illustrates the packet structure 500 in the case where UDP is used to communicate between the client system and the server. In contrast to the raw Ethernet protocol illustrated with reference to FIG. 4, the IP and UDP headers can be used to differentiate configuration packets from other packets. The UDP payload can encapsulate the configuration protocol data, which can have the same format as in the case of raw Ethernet.

Figure 6:
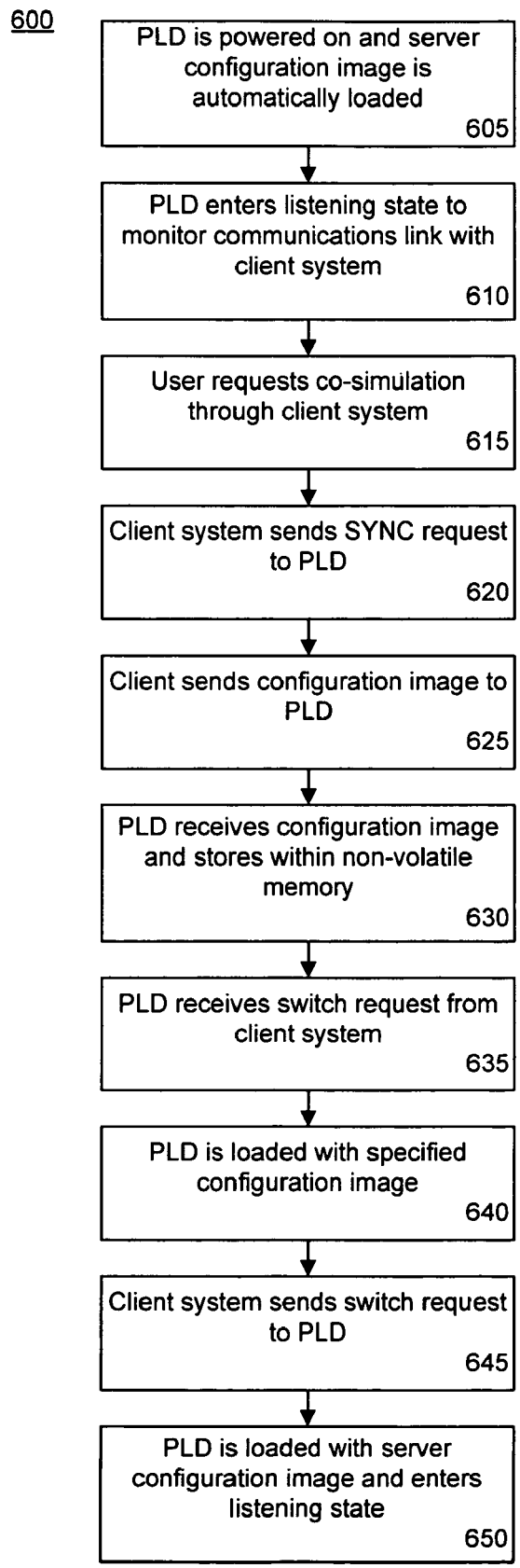
FIG. 6 is a flow chart illustrating a method of configuring a PLD in accordance with yet another embodiment of the present invention.

FIG. 6 is a flow chart illustrating a method 600 for configuring a PLD in accordance with another embodiment of the present invention. For example, in one embodiment, method 600 can be implemented using the system described with reference to FIG. 1. Accordingly, in step 605, the PLD, disposed upon a hardware platform or board can be powered on. The controller can be configured to load the server configuration image into the PLD automatically upon a power-on condition.

In step 610, with the server configuration image loaded, the PLD can enter a listening state where the server monitors the communications link with the client system for activity. More particularly, the server can monitor, or listen, for messages or packets, i.e. SYNC, DATA, or SWITCH requests, which are directed to the server. In step 615, a user can request hardware co-simulation of a particular circuit design through the client system. In step 620, the client system, in response to the user request, can send a SYNC request to the PLD. In one embodiment, the SYNC request can be the first of several messages in the process of initiating a switch function as described herein. In another embodiment, the SYNC request can begin the process of sending a configuration image to the PLD for storage and use at a later time.

In step 625, after receiving a suitable ACK from the server, the client can send a configuration image to the server. The configuration image can include the data necessary to program the PLD to implement a particular circuit design. Additionally, the configuration image can include auxiliary data, if required, to be used by the circuit design once implemented in the PLD. In one embodiment, for example, the configuration image and any accompanying auxiliary data to be used by the PLD when the configuration image is loaded can be sent together, or be encapsulated, as a single item. In any case, the configuration data, whether a configuration image, auxiliary data, or both, can be sent using one or more DATA requests as described with reference to FIG. 3.

In step 630, the PLD can receive the configuration image. The configuration image can be reassembled from the various data requests sent from the client system and stored within the non-volatile memory. In step 635, the server can receive a SWITCH request from the client system. In one embodiment, the SWITCH request can be sent automatically following the configuration image. This embodiment can be useful for hardware co-simulation in that it allows a user to seamlessly request hardware co-simulation of a particular circuit design. The circuit design can be automatically sent to the PLD and loaded. In another embodiment, the SWITCH request need not be sent automatically, but rather in response to another user input or responsive to another condition within the client system.

In any case, in step 640, responsive to a SWITCH request, the PLD is loaded with the specified configuration image. In one embodiment, the SWITCH request can select a configuration image that was just sent to the server to be loaded into the PLD. In another embodiment, the SWITCH request can select a configuration image that is already stored in the memory to be loaded into the PLD, i.e. a configuration image other than the most recent image sent from the client system. The configuration image can be loaded into the PLD from the non-volatile memory. More particularly, when a SWITCH request is received by the server, the server can communicate that condition to the controller. The controller can access the specified configuration image and load it into the PLD.

When a configuration image is loaded into the PLD, the controller can augment the configuration image to include a component and/or subsystem tasked with monitoring for the occurrence of a subsequent SWITCH request. This component allows the PLD to continue monitoring for a SWITCH request despite being largely devoted to the specified configuration image. Because the component need only listen for one particular type of request or command, the structure need not be complex and need not occupy a significant portion of PLD area.

At some point, the client system can send another SWITCH request to the PLD. Responsive to receiving this SWITCH request, the PLD can be loaded with the server configuration image. In an embodiment where hardware co-simulation is being performed, the client can send the SWITCH request when a given hardware co-simulation run is complete. Thus, responsive to receiving the SWITCH request, the above-noted monitoring component can provide a notification to the controller which, in response, loads the server configuration image back into the PLD. The PLD then enters the listening state to await requests for loading further configuration images into memory, loading further auxiliary data into memory, or loading the PLD with another selected configuration image.

When a configuration image is loaded into the PLD, the PLD effectively is initialized. Whether a different circuit design is loaded into the PLD or a same circuit design (configuration image) is loaded into the PLD repeatedly, once loaded, the circuit design is initialized and ready for operation starting in a known state.

It should be appreciated that whether the embodiments disclosed herein are used in the context of hardware co-simulation or within a design to be released into the field, a single cable can be used for sending configuration data, commanding the PLD to load a configuration image, or for communicating with the PLD once a particular configuration image is loaded into memory.

The embodiments disclosed herein facilitate the configuration of one or more PLDs from a client or client system. A PLD can be configured and reconfigured, whether in the context of hardware co-simulation or a working system, responsive to instructions from the client. Configuration data comprised of configuration image(s) and/or auxiliary data can be sent from the client system to the PLD. This data can be stored within a non-volatile memory and subsequently loaded into the PLD. The embodiments disclosed herein facilitate device configuration from a client system via a single cable or data connection. Accordingly, configuration images, commands for loading a different configuration image, auxiliary data, and communications to and from the PLD once configured can be sent through a single communications link or physical connection.

The present invention can be realized in hardware, software, or a combination of hardware and software. The present invention can be realized in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of managing programmable device configuration comprising:
running a server configuration image within the programmable device, wherein the server configuration image represents a first circuit design and implements physical circuitry implementing a server architecture defined by the first circuit design within the programmable device, wherein the server architecture comprises a network interface and is configured to listen for a switch request via the network interface;
storing a different configuration image within a non-volatile memory communicatively linked with the programmable device; and
responsive to the switch request sent from a client to the programmable device over a communications link, loading the different configuration image from the non-volatile memory into the programmable device, wherein the different configuration image specifies a second circuit design and implements different physical circuitry defined by the second circuit design within the programmable device;
wherein the different physical circuitry implements a hardware design that is simulated within a modeling system executing within the client, wherein the different physical circuitry within the programmable device is configured to communicate with the client to perform hardware co-simulation of the hardware design.

2. The method of claim 1, further comprising:
responsive to receiving a request from the client, determining a selected communication protocol from a plurality of communication protocols to use in communicating with the client according to a packet format of the request,
wherein the different configuration image is received from the client using the selected communication protocol.

3. The method of claim 1, further comprising:
receiving, within the programmable device, auxiliary data sent from the client over the communications link while implementing the server architecture; and
storing the auxiliary data within the non-volatile memory while implementing the server architecture.

4. The method of claim 3, further comprising the programmable device, while programmed with the different configuration image, accessing the auxiliary data from the non-volatile memory.

5. The method of claim 1, further comprising re-loading the programmable device with the server configuration image from the non-volatile memory responsive to a switch request received from the client over the communications link thereby re-implementing the server architecture within the programmable device, wherein the server architecture is configured to listen for further switch requests.

6. The method of claim 5, further comprising:
automatically augmenting the different configuration image when loading into the programmable device to configure the different physical circuitry to include monitor circuitry for detecting the switch request.

7. The method of claim 1, wherein a plurality of configuration images are stored within the non-volatile memory, wherein loading the different configuration image into the programmable device further comprises first selecting the different configuration image as indicated by the switch request from the plurality of configuration images stored within the non-volatile memory.

8. The method of claim 1, wherein the server architecture further comprises an ingress buffer configured to store a vector and process packet headers of data received from the client using the vector and an egress buffer configured to store a header template and inject headers into packets of data to be output to the client using the header template, wherein each of the ingress buffer and the egress buffer is coupled to the network interface, wherein the server architecture further comprises a coordination processor controlling operation of the ingress buffer and the egress buffer for packet processing.

9. A system for managing programmable device configuration comprising:
a client;
a programmable device communicatively linked with the client, wherein the programmable device comprises physical circuitry implementing a server architecture defined by a first circuit design within the programmable device, wherein the server architecture comprises a network interface and is configured to listen for a switch request via the network interface from the client;

a non-volatile memory configured to store at least one configuration image for the programmable device; and a controller that selectively loads a configuration image stored in the non-volatile memory into the programmable device responsive to the switch request sent from the client and detected by the programmable device, wherein the configuration image represents a second circuit design and implements different physical circuitry within the programmable device;

wherein the different physical circuitry implements a hardware design that is simulated within a modeling system executing within the client, wherein the different physical circuitry within the programmable device is configured to communicate with the client to perform hardware co-simulation of the hardware design.

10. The system of claim 9, wherein the programmable device, upon power-on, is loaded with a server configuration image that causes the programmable device to listen for configuration data sent from the client.

11. The system of claim 9, wherein the programmable device is configured to receive a configuration image sent from the client and store the configuration image within the non-volatile memory for subsequent use.

12. The system of claim 9, wherein the physical circuitry implements the server architecture comprising an ingress buffer configured to store a vector and process packet headers of data received from the client using the vector and an egress buffer configured to store a header template and inject headers into packets of data to be output to the client using the header template, wherein each of the ingress buffer and the egress buffer is coupled to the network interface, wherein the server architecture further comprises a coordination processor controlling operation of the ingress buffer and the egress buffer for packet processing.

13. The system of claim 9, wherein the physical circuitry is configured to receive the at least one configuration image via a network coupled thereto.

14. The system of claim 13, wherein the controller re-implements the server architecture within the programmable device subsequent to loading the configuration image responsive to a further request from the client.

15. A system comprising:
a programmable device communicatively linked with a client, wherein the programmable device comprises physical circuitry specified by a first circuit design that is selectively configured in a server architecture comprising a network interface configured to listen for a switch request from the client;

a non-volatile memory configured to store at least one configuration image for the programmable device; and a controller that selectively loads a configuration image stored in the non-volatile memory into the programmable device responsive to the switch request sent from the client and detected by the programmable device, wherein the configuration image represents a second circuit design and implements different physical circuitry within the programmable device defined by the second circuit design;

wherein the different physical circuitry implements a hardware design that is simulated within a modeling system executing within the client, wherein the different physical circuitry within the programmable device is configured to communicate with the client to perform hardware co-simulation of the hardware design.

16. The system of claim 15, wherein the programmable device, upon power-on, is loaded with a server configuration image that causes the programmable device to listen for configuration data sent from the client.

17. The system of claim 15, wherein the server architecture further comprises an ingress buffer configured to store a vector and process packet headers of data received from the client using the vector and an egress buffer configured to store a header template and inject headers into packets of data to be output to the client using the header template, wherein each of the ingress buffer and the egress buffer is coupled to the network interface, wherein the server architecture further comprises a coordination processor controlling operation of the ingress buffer and the egress buffer for packet processing.

18. The system of claim 15, wherein the network interface of the server architecture is configured to receive the at least one configuration image via a network coupled thereto.

19. The system of claim 17 wherein the controller implements the server architecture within the programmable device subsequent to loading the configuration image responsive to a further request from the client.

* * * * *